United States Patent
Brummel et al.

(10) Patent No.: US 7,152,192 B2
(45) Date of Patent: Dec. 19, 2006

(54) SYSTEM AND METHOD OF TESTING A PLURALITY OF MEMORY BLOCKS OF AN INTEGRATED CIRCUIT IN PARALLEL

(75) Inventors: Karl P. Brummel, Chicago, IL (US); Todd Mellinger, Fort Collins, CO (US); J. Michael Hill, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 199 days.

(21) Appl. No.: 11/039,666

(22) Filed: Jan. 20, 2005

(65) Prior Publication Data

US 2006/0161824 A1   Jul. 20, 2006

(51) Int. Cl.
*G11C 29/00* (2006.01)
*G11C 7/00* (2006.01)
*G06F 11/00* (2006.01)

(52) U.S. Cl. ............ 714/718; 714/820; 714/710; 365/201

(58) Field of Classification Search ............ None
See application file for complete search history.

(56) References Cited

U.S. PATENT DOCUMENTS

| | | | |
|---|---|---|---|
| 5,075,892 A * | 12/1991 | Choy ............... | 714/719 |
| 5,305,261 A | 4/1994 | Furutani et al. | |
| 5,351,213 A | 9/1994 | Nakashima | |
| 5,428,575 A | 6/1995 | Fudeyasu | |
| 5,539,699 A | 7/1996 | Sato et al. | |
| 5,928,373 A * | 7/1999 | Yoo ............... | 714/719 |
| 5,961,653 A | 10/1999 | Kalter et al. | |
| 5,974,579 A | 10/1999 | Lepejian et al. | |
| 6,061,813 A * | 5/2000 | Goishi ............... | 714/718 |
| 6,088,823 A | 7/2000 | Ayres et al. | |
| 6,259,639 B1 | 7/2001 | Hashizume | |
| 6,263,461 B1 | 7/2001 | Ayres et al. | |
| 6,694,461 B1 | 2/2004 | Treuer | |
| 6,714,466 B1 | 3/2004 | Park et al. | |
| 6,950,334 B1 * | 9/2005 | Shimizu et al. ...... | 365/158 |

* cited by examiner

*Primary Examiner*—Christine T. Tu

(57) ABSTRACT

A method of testing a plurality of memory blocks of an integrated circuit in parallel, wherein each memory block comprising data bit storage cells in an array of rows and columns, and wherein each row of storage cells is addressable to store a word of data bits having a width determined by the number of columns of the array, comprises the steps of: writing test data words in parallel to the rows of the plurality of memory blocks; reading out test data words in parallel from the rows of the plurality of memory blocks to a corresponding plurality of on-chip data word comparators; presenting corresponding expected data words in parallel to the plurality of on-chip data word comparators for comparison with the read out data words of the corresponding memory blocks; concurrently comparing corresponding data bits of the read out data words and expected data words in corresponding data bit comparators to generate a column status bit for each data bit comparison; latching the column status bit of a mismatch bit comparison in the corresponding data word comparator; and reading the column status bits of each on-chip data word comparator.

20 Claims, 4 Drawing Sheets

US 7,152,192 B2

SYSTEM AND METHOD OF TESTING A PLURALITY OF MEMORY BLOCKS OF AN INTEGRATED CIRCUIT IN PARALLEL

BACKGROUND

The present invention relates to testing of memory blocks of an integrated circuit, in general, and, more particularly, to a system and method of testing a plurality of memory blocks of an integrated circuit in parallel using a data word comparator of latching bit registers disposed on the integrated circuit for each memory block thereof.

Memory blocks of a very large scale integrated (VLSI) circuit or chip are generally tested by an off-chip tester programmed to control each memory block under test to perform writes and reads of data, and to perform compares of such data for memory block validation and integrity verification. Memory block testing generally comprises writing test data into registers or rows of the memory block and reading the resultant data therefrom. Performance of the write and read test functions require address, control, read data and write data signal lines which are referred to as input/output (I/O) tester channels. Such I/O tester channel signal lines are brought out to pins of the chip for connecting to the off-chip tester. Once connected, the tester may write test data words into the registers or rows of the memory block under test by placing addresses and test data on the address and write data channels, and issuing write commands. Likewise, the tester may read resultant data words from the registers or rows by issuing a read command and accessing the data over the read data channel for analysis. Generally, the tester is programmed to perform comparisons of the write and read data of each of the registers of a memory block and store and analyze the results.

Typically, many of the on-chip memory blocks are identical, like tag memories in an associative cache, for example. Accordingly, an identical test may be run on each such memory block. For such chips having multiple memory blocks, the test designer has to make a trade off decision between testing the multiple memory blocks sequentially or in parallel. Testing the memory blocks of a chip in parallel requires a large amount of I/O bandwidth support, i.e. a large number of I/O tester channels. Testing the individual memory blocks of a chip sequentially increases the amount of test time.

SUMMARY

In accordance with one aspect of the present invention, a method of testing a plurality of memory blocks of an integrated circuit in parallel, wherein each memory block comprising data bit storage cells in an array of rows and columns, and wherein each row of storage cells is addressable to store a word of data bits having a width determined by the number of columns of the array, comprises the steps of: writing test data words in parallel to the rows of the plurality of memory blocks; reading out test data words in parallel from the rows of the plurality of memory blocks to a corresponding plurality of on-chip data word comparators; presenting corresponding expected data words in parallel to the plurality of on-chip data word comparators for comparison with the read out data words of the corresponding memory blocks; concurrently comparing corresponding data bits of the read out data words and expected data words in corresponding data bit comparators to generate a column status bit for each data bit comparison; latching the column status bit of a mismatch bit comparison in the corresponding data word comparator; and reading the column status bits of each on-chip data word comparator.

DETAILED DESCRIPTION

Figure 1:
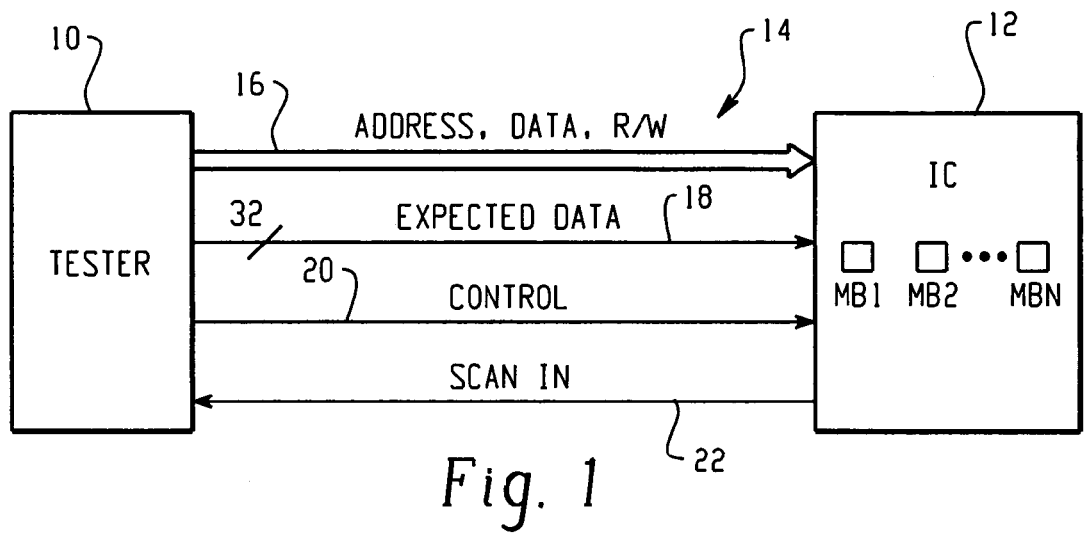
FIG. 1 is a block diagram schematic of an exemplary tester arrangement.

FIG. 1 is a block diagram schematic of an exemplary tester arrangement. Referring to FIG. 1, an off-chip tester unit 10 which may be a programmed micro-processor based controller, for example, is coupled to an integrated circuit (IC) under test 12 using a plurality of signal lines 14. The IC 12 may comprise an associative cache, for example, which includes a plurality of integrated memory blocks MB1, MB2, . . . , MBN which may be tag memories of the associative cache. Each memory block of the plurality comprising data bit storage cells in an array of rows and columns wherein each row of storage cells is addressable to store a word of data bits having a width determined by the number of columns of the array.

Figure 2:
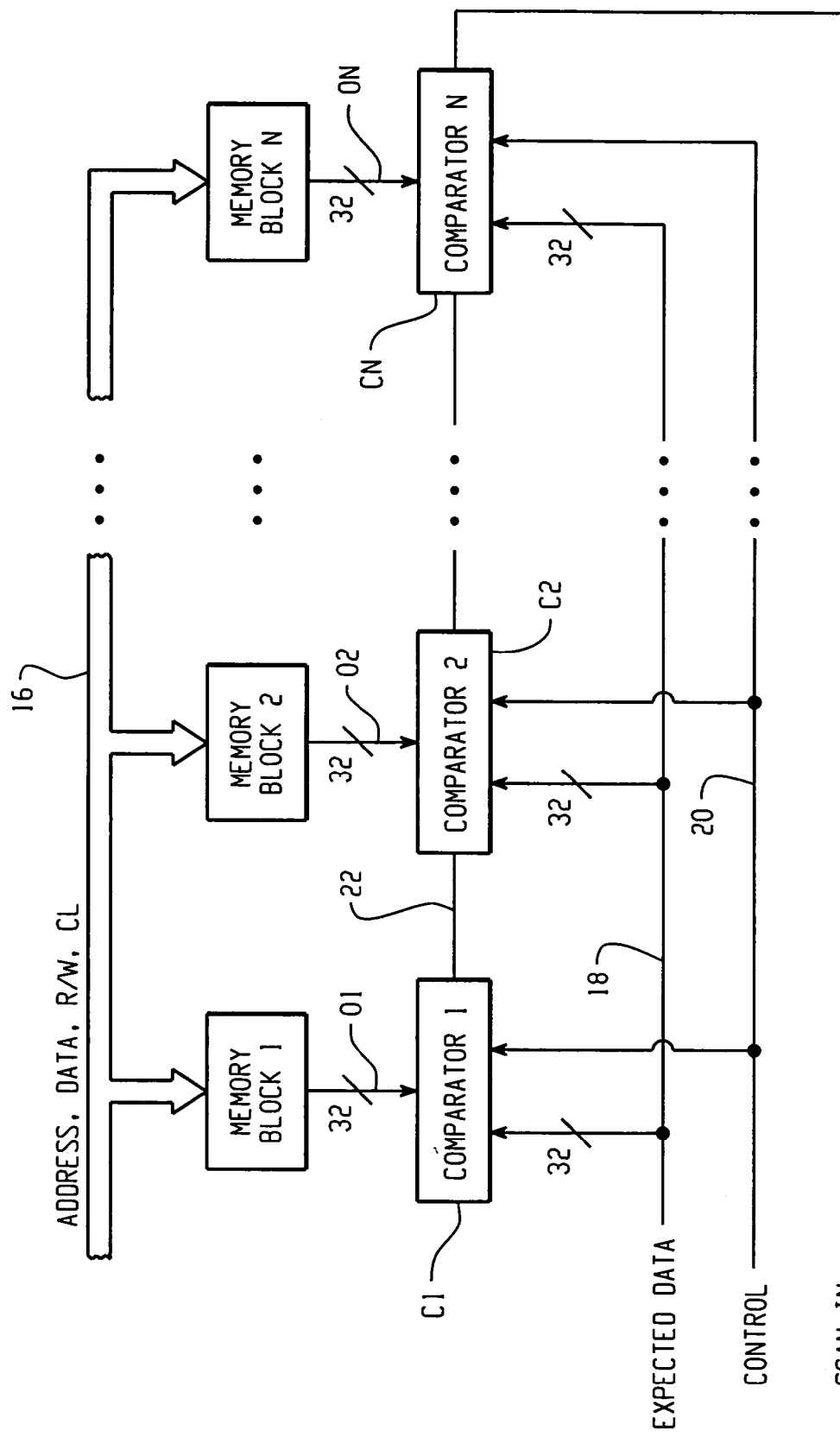
FIG. 2 is a block diagram schematic of an integrated circuit arrangement of the memory blocks under test.

A block diagram schematic of an integrated circuit arrangement of the memory blocks under test MB1, MB2, . . . , MBN is shown in FIG. 2. The memory blocks MB1, MB2, . . . , MBN are of the column redundant array variety, i.e. each memory block includes redundant columns of the memory array which may be used for repair purposes. In the present embodiment, the rows of the memory blocks are each 32 bits wide. In other words, each memory block of the plurality has an array of 32 columns. Referring to FIGS. 1 and 2, a bus of signal lines 16 are distributed on the IC 12 to the memory blocks MB 1, MB2, . . . , MBN in a parallel arrangement and are brought out to I/O connector pins of the IC 12 from which they may be connected to the tester 10. The bus 16 includes address lines, data lines and control lines which may include a clock and read/write (R/W) control signals.

Accordingly, the tester 10 may access a row of each of the memory blocks concurrently using the address lines of bus 16. The same data word, which may be 32 bits wide for the present embodiment, may be written into the accessed row of each of the memory blocks from the data lines by setting the R/W control line(s) to write. Likewise, data may be addressed and read from the same row of each of the memory blocks over the respective output buses O1, O2, . . . , ON, which are also 32 bits wide for the present embodiment, using the address lines of bus 16 and setting the R/W control to read. All actions performed by the tester 10 on the IC 12 may be synchronized using a common clock signal CL which may be part of the bus 16.

Also disposed on the integrated circuit 12 are a plurality of digital word comparators C1, C2, . . . , CN which are coupled to the respective output buses O1, O2, . . . , ON so that each output line or bit of an output bus is coupled to an input of a latching bit comparator register of its respectively corresponding comparator C1, C2, . . . , CN. Further disposed on the IC 12 is an expected data bus 18 which is also 32 bits wide for the present embodiment. The bus 18 may be distributed in parallel to all of the on-chip comparators C1, C2, ..., CN and is brought out to I/O connector pins of the IC 12 from which they may be connected to the tester 10. Each output line or bit of the bus 18 is coupled to another input of the respective bit latching comparator register of each of the digital comparators C1, C2, ..., CN. Accordingly, data bits EB1, EB2, ..., EB32 of the word distributed over expected data bus 18 are compared to respectively corresponding data bits B1, B2, ..., B32 of the word read from the block memories over output data buses O1, O2, ..., ON in the respectively corresponding digital comparators C1, C2, ..., CN.

While in the present embodiment the expected data bus 18 is shown as separate from the data lines of bus 16, it is understood that the data lines of bus 16 may be shared to include the expected data as well as the write data in order to minimize tester channels. The shared use of the data lines of bus 16 in this alternate embodiment may be controlled by signals provided over the control lines of bus 16.

Also disposed on the IC 12 are control lines 20 which may include a clock signal CL, a read signal READ and a reset signal RESET, for example. The control lines 20 are distributed to each of the latching bit comparator registers of the comparators C1, C2, ..., CN and brought out to I/O connector pins of the IC 12 for connecting to the tester 10. In addition, in the present embodiment, each digital comparator C1, C2, ..., CN may include a shift register which may be 32 bits wide, for example. Each bit of a comparator shift register may be coupled to the output of a respective bit comparator to store the bit status thereof. The shift registers of the comparators C1, C2, ..., CN may be coupled together, output to input, along a serial bus 22 which is brought out to a connector pin of the IC 12 for connecting to the tester 10.

Figure 3:
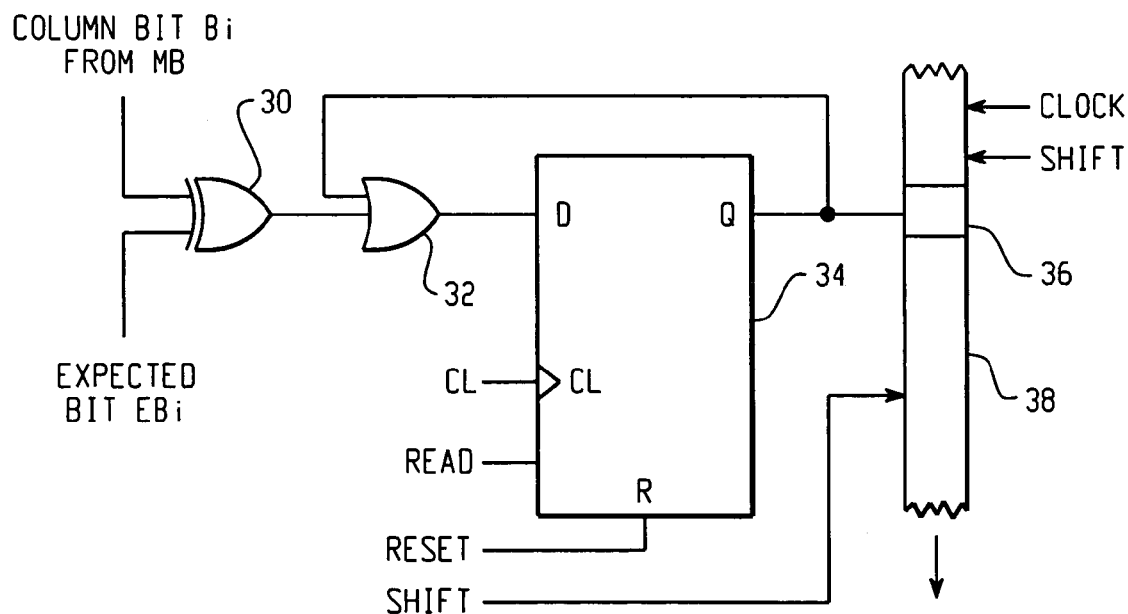
FIG. 3 is a circuit schematic of an exemplary latching bit comparator suitable for use in the embodiment of FIG. 2.

FIG. 3 is a circuit schematic of an exemplary latching bit comparator suitable for use in the digital word comparators C1, C2, ..., CN. Referring to FIG. 3, a column bit Bi, where i is an integer from 1 to 32 in the present embodiment, from the output bus $O_n$ of a memory block $MB_n$, where n is an integer from 1 to N, is coupled to one input of an exclusive OR gate 30 and the respectively corresponding data bit EBi from the expected data bus 18 (or data lines of bus 16) is coupled to the other input of gate 30. The output of gate 30 is coupled to one input of an OR gate 32 whose output is coupled to a data D input of a D-type flip flop circuit 34. Control signals clock CL, READ, and RESET from control lines 20 are coupled to respective inputs of the flip flop circuit 34. An output Q of the circuit 34, indicative of the pass or fail status of a column of its corresponding memory block, is coupled to a respective storage cell 36 of a shift register 38 and to another input of the OR gate 32. The column status bits of the shift register 38 may be scanned out over serial bus 22 by a SHIFT signal which may be part of the control signal lines 20.

In operation, a mismatch in corresponding data bits Bi and EBi between the read and expected data word bits, respectively, will be determined by the exclusive OR gate 30 which will produce a digital one (indicative of a column failure) at its output which is coupled through OR gate 32 to the D input of the flip flop circuit 34. A pulse of clock CL will store the bit status of the output of gate 30 at the output Q of the flip flop 34 and in the storage cell 36 of the shift register 38. A failure status (logical one) at output Q is latched by feeding it back to the other input of the OR gate 32, thus maintaining the output Q at a logical one. Accordingly, once the output Q is set to a failed column state (i.e. logical one), it is latched until the flip flop circuit 34 is reset.

Figure 4A:
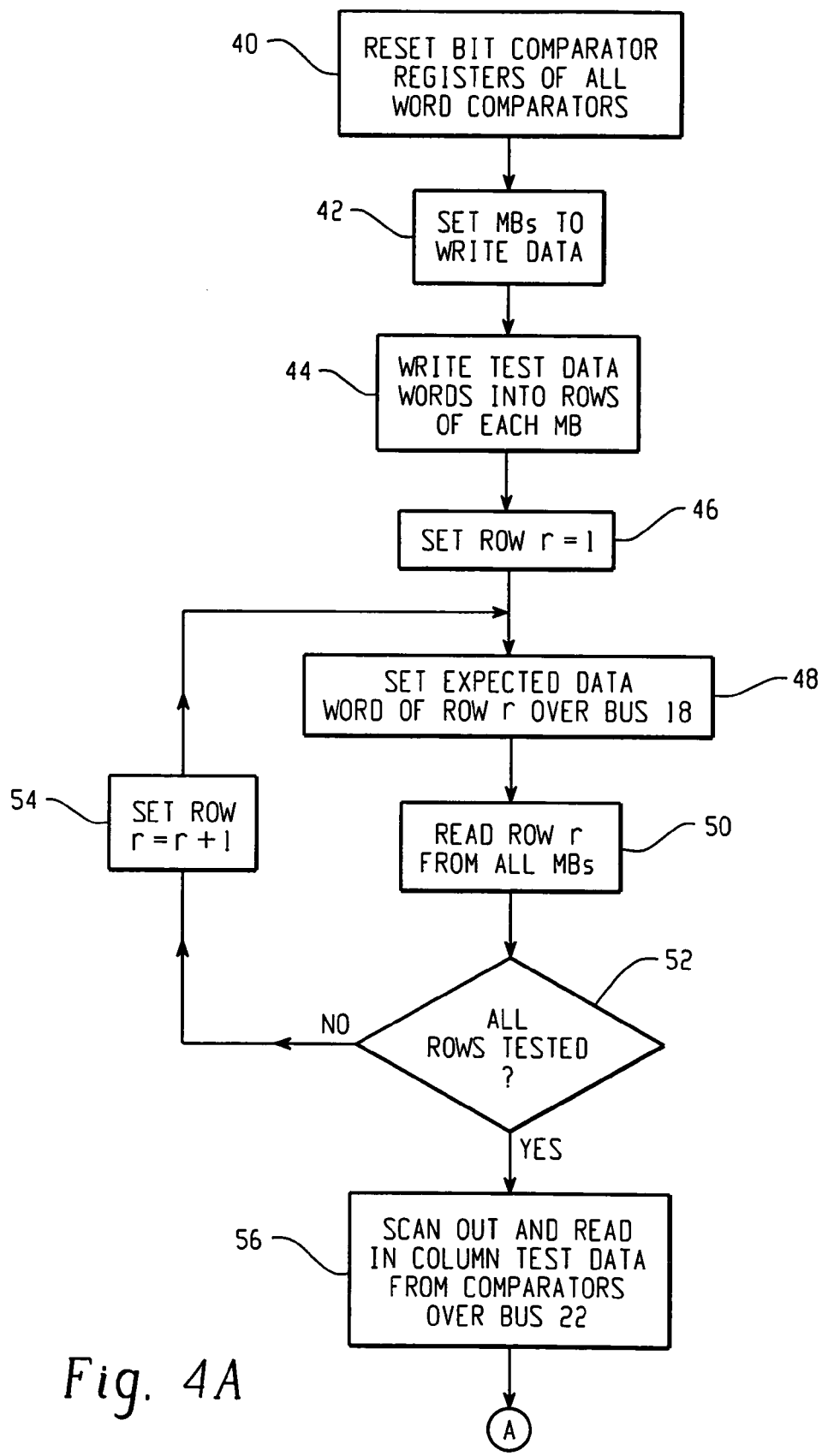
FIGS. 4A and 4B compositely depict a flow chart of exemplary test steps.
Figure 4B:
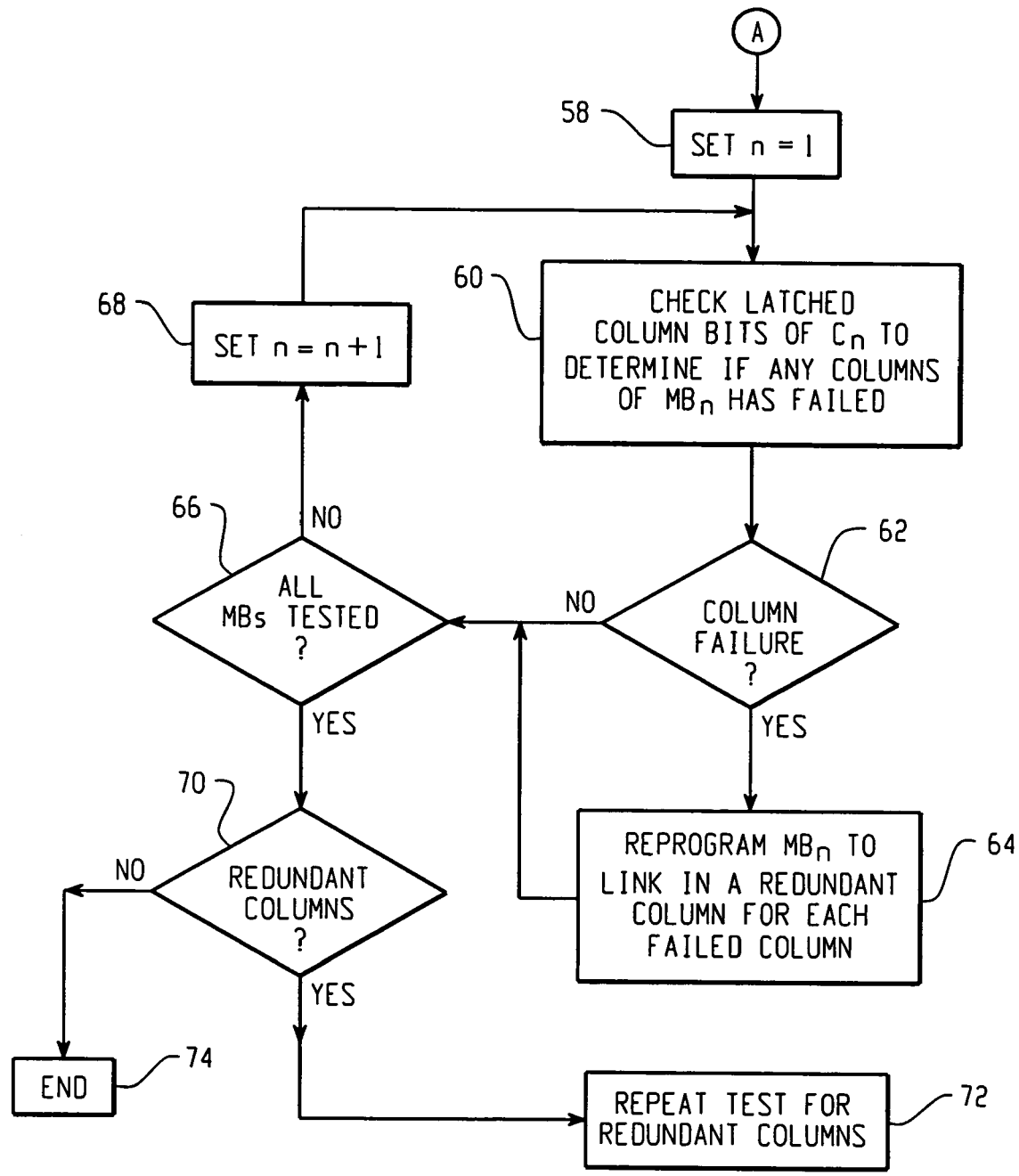

FIGS. 4A and 4B compositely depict a flow chart of exemplary test steps to test the plurality of memory blocks MB1, MB2, ..., MBN in parallel using the off-chip tester unit 10. Reference will be made to the embodiments of FIGS. 1–3 in describing the exemplary test steps. Referring to FIGS. 4A and 4B, the test may commence at step 40 in which the tester 10 may issue a reset command over the RESET line of control bus 20 to reset all of the latching bit comparator registers to zero. Then, in step 42, the memory blocks MB1, MB2, ..., MBN are set to write data using the R/W control line of bus 16, and test data words are written into the rows of the memory blocks MB1, MB2, ..., MBN using the address and data lines of bus 16 in step 44.

In step 46, a row index r is set to one. Then, in step 48, the expected data word for row r is output over the bus 18 (or the data lines of bus 16) to all of the digital word comparators C1, C2, ..., CN and in step 50, the test data word in row r of all of the memory blocks M1, M2, ..., MN is read out over the respectively corresponding output buses O1, O2, ... ON. Respective bit comparisons Bi and EBi are automatically performed in parallel between the read and expected date words by the latching bit comparator registers of the comparators C1, C2, ..., CN as described supra for the embodiment of FIG. 3. Any column bit mismatches will be latched in the corresponding flip flop circuit 34 and storage cell 36 of the shift register 38. Thereafter, in step 52, it is determined if all of the rows of the plurality of memory blocks have been tested. If not, the row index r is incremented to r+1 in step 54 and steps 48, 50 and 52 are repeated for the new row index. In this manner, all of the rows of all of the memory blocks will be tested in parallel against expected data for failures.

If the result of step 52 is positive, then in step 56, the column status words of the shift registers of the comparators C1, C2, ..., CN are shifted out over serial bus 22 using the SHIFT signal, for example, and read into the tester 10 for analysis. In step 58, an index n is set to a one. Next, in step 60, the bits of the column status data word read in from comparator $C_n$ are checked to determine if any column of $MB_n$ has failed. Note that the column bit index of a bit set to one in the status word will represent the failed column of $MB_n$. In decision block 62, it is determined if there are any column failures indicated in the status word of $C_n$. If so, the memory block $MB_n$ is reprogrammed to replace each failed column with a redundant column on the chip in step 64. This may be accomplished in the present embodiment by the opening and closing of programmable links which may be performed electrically. Then, decision step 66 is performed. Step 66 is also performed if there are no column failures determined by step 62.

In step 66, it is determined if the column status words of all of the memory blocks have been analyzed by the tester 10. If not, the index n is incremented to n+1 in step 68 and steps 60, 62, 64 and 66 are repeated for the index n+1. If step 66 determines that all of the column status words have been analyzed, then it is next determined in step 70 if any redundant columns were programmed into any of the memory blocks. If so, the test is repeated by step 72 starting at step 40. Otherwise, if all of the memory blocks passed the test, i.e. without column failure, then the test ends at step 74.

While the flow chart of FIGS. 4A and 4B presents steps to write data to the registers of the memory blocks, and then, read data from the registers of the memory blocks in a sequential order, it is understood that in a more general case, data may be written to and read from an addressed register of the memory blocks in a random access manner just as well without deviating from the broad principles of the present invention. The present system architecture provides for the ability to ping pong back and forth between writes and reads of different register addresses of the memory blocks. In this alternate embodiment, with each data word write/read operation on a memory register, the expected data is provided over the data bus for comparison to the data word read from the addressed register of the memory blocks.

While the present embodiment employs shift registers and a serial bus to scan out the column status words of the comparators C1, C2, . . . , CN, it is understood that other techniques may be employed to access the column data words just as well. For example, address lines may be provided from the tester 10 to the comparators C1, C2, . . . , CN and the column status words thereof may be accessed over a parallel data bus coupled to the tester 10. Accordingly, the embodiments described herein above were presented merely by way of example and should not be used to limit the invention in any way. Rather, the present invention should be construed in breadth and broad scope in accordance with the recitation of the claims appended hereto.

What is claimed is:

1. An integrated circuit for accommodating the parallel testing of a plurality of memory blocks disposed therein, each memory block comprising data bit storage cells in an array of rows and columns, wherein each row of storage cells is addressable to store a word of data bits having a width determined by the number of columns of the array, said integrated circuit comprising:
    a first bus distributed in parallel to said plurality of memory blocks, said first bus comprising row address, data word and control lines which are brought out to first input/output (I/O) pins of the integrated circuit;
    a set of data word output lines coupled from each memory block of said plurality for reading out data words accessed therefrom;
    a data word comparator for each of said plurality memory blocks, each data word comparator comprising a latching bit comparator for each column of the corresponding memory block;
    a second bus distributed in parallel to the plurality of data word comparators, said second bus comprising data word lines which are brought out to second I/O pins of the integrated circuit;
    each of said latching bit comparators having one input coupled to a respectively corresponding data word output line of the corresponding memory block, another input coupled to a respectively corresponding data word line of the second bus, and an output for providing a column status bit; and
    comparator control lines distributed in parallel to said latching bit comparators and brought out to third I/O pins of the integrated circuit.

2. The integrated circuit of claim 1 including a shift register for each data word comparator, each shift register comprising storage cells for storing the column status bits of the latching bit comparators of the corresponding data word comparator; and wherein the shift registers are coupled in series over a serial bus which is brought out to another I/O pin of the integrated circuit.

3. The integrated circuit of claim 2 including a shift signal line distributed in parallel to the shift registers and brought out to yet another I/O pin of the integrated circuit.

4. The integrated circuit of claim 1 wherein each latching register comprises:
    an exclusive OR gate having one input coupled to a respectively corresponding data word output line of the corresponding memory block, another input coupled to a respectively corresponding data word line of the second bus, and an output; and
    a latching register circuit having an input coupled to the output of the exclusive OR gate and an output for providing the corresponding column status bit.

5. The integrated circuit of claim 4 wherein each latching register is coupled to the comparator control lines for operation thereof.

6. The integrated circuit of claim 4 wherein each latching register comprises:
    an OR gate having an input coupled to the output of the exclusive OR gate and an output; and
    a flip flop circuit having a data input coupled to the output of the OR gate and an output for providing the corresponding column status bit, said output coupled to another input of the OR gate.

7. System for testing a plurality of memory blocks of an integrated circuit in parallel, each memory block comprising data bit storage cells in an array of rows and columns, wherein each row of storage cells is addressable to store a word of data bits having a width determined by the number of columns of the array, said system comprising:
    an off-chip tester unit for testing the plurality of memory blocks of said integrated circuit in parallel;
    a first bus coupled to said tester unit and distributed in parallel to said plurality of memory blocks through first input/output (I/O) pins of the integrated circuit, said first bus comprising row address, data word and control lines controllable by said tester unit;
    a set of data word output lines coupled from each memory block of said plurality for reading out data words accessed therefrom;
    a data word comparator for each of said plurality memory blocks, each data word comparator comprising a latching bit comparator for each column of the corresponding memory block;
    a second bus coupled to said tester unit and distributed in parallel to the plurality of data word comparators through second I/O pins of the integrated circuit, said second bus comprising expected data word lines controllable by said tester unit;
    each of said latching bit comparators having one input coupled to a respectively corresponding data word output line of the corresponding memory block, another input coupled to a respectively corresponding data word line of the second bus, and an output for providing a column status bit; and
    comparator control lines coupled to said tester unit and distributed in parallel to said latching bit comparators through third I/O pins of the integrated circuit.

8. The system of claim 7 wherein the integrated circuit includes a shift register for each data word comparator, each shift register comprising storage cells for storing the column status bits of the latching bit comparators of the corresponding data word comparator; and wherein the shift registers are coupled in series over a serial bus which is coupled to the tester unit through another I/O pin of the integrated circuit.

9. The system of claim 8 wherein the shift registers of the integrated circuit are controllable by the tester unit to scan out the column status bits thereof to the tester unit serially over the serial bus.

10. The system of claim 7 wherein the latching bit comparators are controlled in parallel by the tester unit through the comparator control lines thereof.

11. The system of claim 10 wherein the comparator control lines includes a reset line controllable by the tester unit to reset the latching bit comparators of the data word comparators.

12. The system of claim 7 wherein the tester unit is operative to: (a) write test data words in parallel to the rows of the plurality of memory blocks through control of the lines of the first bus; (b) read out test data words in parallel from the rows of the plurality of memory blocks to the corresponding set of data word output lines through control of the lines of the first bus; and (c) present corresponding expected data words over the second bus to the data word comparators for comparison with the read out data words.

13. The system of claim 12 wherein the data word comparators are operative in parallel to compare the data bits of each test data word read out from a row of the corresponding memory block with respectively corresponding data bits of the expected data word presented over the second bus by corresponding latching bit comparators thereof; and wherein each latching bit comparator is operative to latch the column bit status of a data bit mismatch.

14. The system of claim 13 wherein the tester unit is operative to read the column bit status of the latching bit registers of the data word comparators for identifying failed columns of the corresponding memory blocks.

15. The system of claim 14 wherein the integrated circuit comprises redundant memory array columns of storage cells; and wherein the integrated circuit is reprogrammable to replace a failed column with a redundant column.

16. Method of testing a plurality of memory blocks of an integrated circuit in parallel, each memory block comprising data bit storage cells in an array of rows and columns, wherein each row of storage cells is addressable to store a word of data bits having a width determined by the number of columns of the array, said method comprising the steps of:
   writing test data words in parallel to the rows of the plurality of memory blocks;
   reading out test data words in parallel from the rows of the plurality of memory blocks to a corresponding plurality of on-chip data word comparators;
   presenting corresponding expected data words in parallel to the plurality of on-chip data word comparators for comparison with the read out data words of the corresponding memory blocks;
   concurrently comparing corresponding data bits of the read out data words and expected data words in corresponding data bit comparators to generate a column status bit for each data bit comparison;
   latching the column status bit of a mismatch bit comparison in the corresponding data word comparator; and
   reading the column status bits of each on-chip data word comparator.

17. The method of claim 16 including the step of resetting the data word comparators prior to testing the plurality of memory blocks.

18. The method of claim 16 including indexing the column status bits of each word comparator to be commensurate with the columns of the corresponding memory block.

19. The method of claim 16 including identifying a failed column in each memory block from the read column status bits of the corresponding word comparator.

20. The method of claim 19 including reprogramming the integrated circuit to replace a failed column of a memory block with a redundant column.

* * * * *

UNITED STATES PATENT AND TRADEMARK OFFICE
CERTIFICATE OF CORRECTION

PATENT NO. : 7,152,192 B2 Page 1 of 1
APPLICATION NO. : 11/039666
DATED : December 19, 2006
INVENTOR(S) : Karl P. Brummel et al.

It is certified that error appears in the above-identified patent and that said Letters Patent is hereby corrected as shown below:

In column 5, line 36, in Claim 1, after "each" insert -- memory block --.

In column 5, line 36, in Claim 1, after "plurality" insert -- of --.

In column 6, line 35, in Claim 7, after "each" insert -- memory block --.

In column 6, line 35, in Claim 7, after "plurality" insert -- of --.

Signed and Sealed this

Eleventh Day of November, 2008

JON W. DUDAS
*Director of the United States Patent and Trademark Office*